(12) United States Patent
Chao et al.

(10) Patent No.: US 9,213,351 B2
(45) Date of Patent: Dec. 15, 2015

(54) BI-DIRECTIONAL CURRENT SENSOR

(71) Applicant: Analog Devices, Inc., Norwood, MA (US)

(72) Inventors: Hio Leong Chao, San Jose, CA (US); A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 125 days.

(21) Appl. No.: 14/087,728

(22) Filed: Nov. 22, 2013

(65) Prior Publication Data

US 2015/0145588 A1  May 28, 2015

(51) Int. Cl.
*H03K 5/22* (2006.01)
*G05F 3/26* (2006.01)
*G01R 19/00* (2006.01)
*H01L 23/38* (2006.01)
*G01R 19/14* (2006.01)

(52) U.S. Cl.
CPC ............ *G05F 3/262* (2013.01); *G01R 19/0092* (2013.01); *G01R 19/14* (2013.01); *H01L 23/38* (2013.01)

(58) Field of Classification Search
USPC ...................................................... 327/50–52
See application file for complete search history.

(56) References Cited

U.S. PATENT DOCUMENTS

| | | | |
|---|---|---|---|
| 5,084,633 A | 1/1992 | Izadinia | |
| 5,097,403 A | 3/1992 | Smith | |
| 5,210,475 A | 5/1993 | Juzswik et al. | |
| 5,225,811 A | 7/1993 | Audy | |
| 6,559,684 B2 | 5/2003 | Goodfellow et al. | |
| 7,847,634 B2 | 12/2010 | Barrow et al. | |
| 2003/0103364 A1 | 6/2003 | Alfrey et al. | |
| 2006/0220459 A1* | 10/2006 | Kulasekeram | 307/11 |
| 2013/0063113 A1 | 3/2013 | Couleur et al. | |

FOREIGN PATENT DOCUMENTS

DE        10223977 C1       9/2003

OTHER PUBLICATIONS

"MAX1978/MAX1979 Integrated Temperature Controllers for Peltier Modules", Maxim Integrated Products., 1-20.
"MAX8520/MAX8521 Smallest TEC Power Drivers for Optical Modules", Maxim Integrated Products, Inc., 1-18.
"Thermoelectric Cooler (TEC) Controller", ADN8831, [Online]. Retrieved from Internet <http://www.analog.com/static/imported-files/data_sheets/ADN8831.pdf>, (Accessed Nov. 18, 2013), 1-20 pgs.
"Thermoelectric Temperature Control Using the ispPAC20", [Online] Retrieved from Internet <http://www.latticesemi.com/~/media/Documents/ApplicationNotes/ThermoelectricTemperatureControlUsingtheispPAC20.PDF?document_id=3147>, (Accessed Nov. 18, 2013), 1-21.
"European Application Serial No. 14194029.6, Extended European Search Report mailed Apr. 30, 2015", 8 pgs.

\* cited by examiner

*Primary Examiner* — An Luu
(74) *Attorney, Agent, or Firm* — Schwegman Lundberg & Woessner, P.A.

(57) ABSTRACT

A bidirectional current sensor circuit can be configured to generate a scaled version of a load current using a first transistor from a power regulator output stage and a second transistor that can be a mirror or scaled version of the first transistor. A trim circuit can be provided to correct gain errors under current sinking or current sourcing conditions. In an example, the bidirectional current sensor circuit can be configured to detect a polarity or a magnitude of a current signal that is used to operate a thermoelectric device.

20 Claims, 5 Drawing Sheets

BI-DIRECTIONAL CURRENT SENSOR

TECHNICAL FIELD

This document pertains generally, but not by way of limitation, to circuits configured to provide information about a polarity or a magnitude of an electrical signal.

BACKGROUND

A current sensor circuit can include one or more circuit components arranged to detect a current and provide a corresponding output signal, such as an output voltage signal. In an example, a current sensor circuit can be configured to provide an output voltage signal that is proportional to a detected or measured current signal. Current sensor circuits can be optimized to detect different ranges of current signal magnitudes or frequencies, or to operate under various environmental conditions.

An example of a current sensor can include a resistor configured as a current-to-voltage converter. A current I through a resistor R produces a voltage V according to Ohm's law, $V=IR$. The resistor can thus provide a substantially linear voltage response to a current signal over a particular operating range. A current sensor that includes a resistor to provide a current-to-voltage conversion can generally be inexpensive, accurate, and can be configured to measure DC or AC current signals. However, resistor-based current sensors can consume a significant amount of power, and can introduce unwanted resistance in the circuit path.

Overview

The present inventors have recognized, among other things, that a problem to be solved can include improving performance of a current sensor circuit. The present inventors have recognized a need, in some current sensing applications, to accurately measure a bi-directional current signal and minimize power consumption of the measured signal. The present inventors have further recognized a need for a current sensor circuit that can accurately measure a bi-directional current provided to or received from a thermoelectric cooling or heating device (TEC), such as to provide information about an operating status of the TEC. In an example, a TEC can be used to provide thermal control for an optical device, such as an optical transceiver, an optical fiber amplifier, or one or more other temperature-sensitive components. Thermoelectric cooling or heating devices can operate according to the Peltier effect, such as to bring heat from one side of a device to the other. In an example, when a voltage applied across the two sides of a TEC is positive, the TEC can be in cooling mode, and when the voltage applied is negative, the TEC can be in a heating mode.

The present subject matter can help provide a solution to these or other problems, such as using a current sensor circuit that includes a complementary output circuit. The complementary output circuit can include first and second transistors that are configured to provide or receive a load current at an output node. The first transistor in the complementary output can be of a first type (e.g., p-type), and the second transistor in the complementary output can be of a different second type (e.g., n-type). The load current can include respective first or second currents at respective first or second reference nodes (e.g., $V_{DD}$ and/or GND), such as through respective ones of the first or second transistors. The current sensor circuit can include a first mirror or replica transistor, coupled between the first reference node (e.g., $V_{DD}$) and a mirror node, and a second mirror or replica transistor, coupled between the mirror node and the second reference node (e.g., GND). The first and second mirror or replica transistors can be scaled versions of the first and second transistors, respectively. In an example, the current sensor circuit can include a buffer circuit that is configured to provide a signal that is indicative of the load current, such as when voltages at the output node and the mirror node are driven to about the same voltage magnitude.

In an example, the present subject matter can help provide a solution to the above-mentioned problems by providing a method for sensing a load current signal magnitude or load current signal polarity using a complementary output stage of a power converter circuit. The method can include driving first and second transistors, such as in a complementary output stage of the linear regulator, to provide a load current to an output node. The load current can include respective first or second currents from respective first or second reference nodes (e.g., $V_{DD}$ and/or GND), through respective ones of the first or second transistors, to the output node. The method can include providing a first scaled load current signal using first and second mirror transistors that correspond to the first and second transistors in the complementary output stage, respectively, and using a buffer circuit to maintain or provide a voltage across at least one of the first and second mirror transistors to approximate a voltage across a corresponding one of the first and second transistors in the complementary output stage. An output current signal can be provided using the buffer circuit. In an example, the output current signal can include information about the load current signal magnitude and about the load current signal polarity. In an example, the load current signal magnitude and polarity can provide information about whether a TEC is operating in a heating or cooling mode.

This Overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A bi-directional current sensor circuit can be configured to provide a voltage signal or a current signal that is indicative of one or more characteristics of a load current. For example, the current sensor circuit can provide information about a frequency, magnitude, polarity, or phase of the load current. The current sensor circuit can be configured to consume a minimal amount of power from the load current to reduce power loss and loading effects. In an example, the current sensor circuit can be configured to provide an output signal that is substantially proportional to the load current.

Some devices can operate using current signals having different characteristics, such as different magnitudes or polarities. For example, a thermoelectric heating or cooling device (TEC) can be configured to transfer heat in a first direction and at a first rate in response to a current signal having a first magnitude and first polarity, and the TEC can be configured to transfer heat in a second direction and at a second rate in response to a current signal having a second magnitude and second polarity. In an example, a current sensor circuit can be configured to provide information about an operating status of a TEC. For example, the current sensor circuit can provide an output voltage signal indicative of whether the TEC is in a heating mode, a cooling mode, or off mode, and can further provide an output voltage signal indicative of a magnitude or rate of the TEC heating or cooling.

Figure 1:
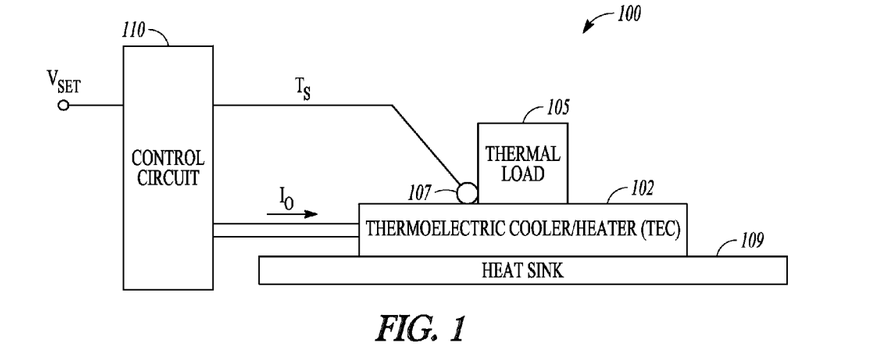
FIG. 1 illustrates generally an example that can include a thermal system.

FIG. 1 illustrates generally an example of a thermal system 100. The thermal system 100 can include a TEC 102, a control circuit 110, a thermal load 105, and a heat sink 109. In an example, a current sensor circuit can be used with or integrated with the control circuit 110. In an example, the control circuit 110 can include one or more power amplifiers, such as FETs, configured to drive the TEC 102. A control voltage input signal $V_{SET}$ can be provided to the control circuit 110. In response to $V_{SET}$, the control circuit 110 can provide a load current $I_O$ that is configured to maintain or adjust the heating or cooling mode of the TEC 102, such as to maintain the thermal load 105 at a specified temperature. The heat sink 109 can be provided to smooth transitions between heating and cooling. The heat sink 109 can be configured to act as a sink for thermal energy when the thermal load 105 is driven to a lower temperature, or the heat sink 109 can be configured to act as a source of thermal energy when the thermal load 105 is driven to a higher temperature. In an example, the control voltage input signal $V_{SET}$ can be generated by a digital-to-analog converter circuit that is part of a temperature control feedback loop of a thermal system.

The thermal system 100 can include a temperature sensor 107 configured to provide a temperature signal $T_S$ to the control circuit 110. The control circuit 110 can receive $T_S$ and, in response, maintain or adjust the load current $I_O$. In an example, the control circuit 110 includes, among other things, a comparator circuit to compare $T_S$ to a reference signal, an error-correcting signal generator configured to provide information about the difference between $T_S$ and the reference signal, and a current signal generator configured to generate the load current $I_O$.

In an example, one or more sense components can be configured to sense information about $I_O$, such as alternatively or additionally to using the temperature sensor 107. A sense component can include a resistor, such as placed in series with the load, or a sense component can include a thermistor, a platinum RTD, or other component that can be configured to sense a temperature or a change in temperature, and in response, provide the temperature signal $T_S$. In an example, information about a voltage signal from the sense component can be used to provide information about the temperature, for example, to provide information about a heating or cooling status of the TEC 102. A control loop can be closed around the sense component and the TEC 102, and the information about the measured voltage signal across the sense component, such as relative to a reference signal, can be used to update the TEC 102 operating status. In some examples, a thermal loop can be provided using op amps, such as together with a digital-to-analog converter circuit or adjustable resistor, to set a control temperature. A thermal loop can also be implemented digitally, such as using a precision analog-to-digital converter circuit to receive information from the sense component, a microcontroller to implement a control algorithm, and a digital-to-analog converter circuit to provide an appropriate signal to the control circuit 110.

Figure 2:
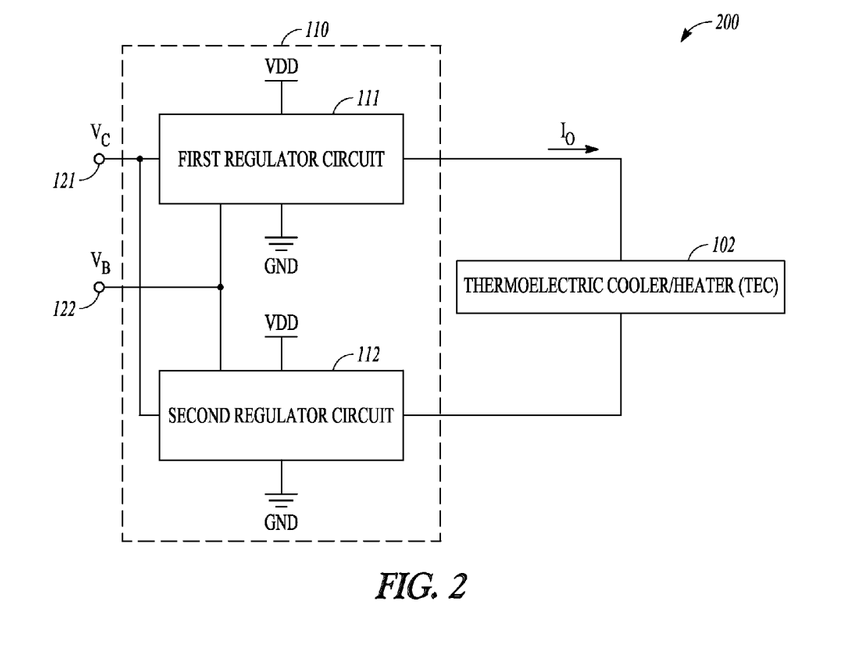
FIG. 2 illustrates generally an example that can include a control circuit for a thermal system.

FIG. 2 illustrates generally an example 200 that can include the control circuit 110 and the TEC 102. The control circuit 110 can include one or more power regulator circuits. In an example, the control circuit 110 includes a first power regulator circuit 111 operable from a supply $V_{DD}$. The control circuit 110 can include a second power regulator circuit 112 operable from the same supply VDD. The first and second power regulator circuits 111 and 112 can be configured to bias a load, such as the TEC 102, between the outputs of the first and second power regulator circuits. In an example, the first and second power regulator circuits 111 and 112 can provide the load current $I_O$, and corresponding TEC temperature control, without a "dead zone" or other nonlinearity, such as under low load current ($I_O$) conditions.

The control circuit 110 can include a control signal input terminal 121 or a bias signal input terminal 122. The control signal input terminal 121 can be configured to receive a power stage input signal $V_C$. The bias signal input terminal 122 can be configured to receive a bias signal $V_B$. When the input signal $V_C$ is less than the bias signal $V_B$, the first and second power regulator circuits 111 and 112 can be configured to provide the load current $I_O$ in a first direction, or first polarity. When the input signal $V_C$ is greater than the bias signal $V_B$, the first and second power regulator circuits 111 and 112 can be configured to provide the load current $I_O$ in a second direction, or second polarity. In an example, a relative magnitude of the input signal $V_C$ and the bias signal $V_B$ can correspond to a desired magnitude of the load voltage.

In an example that can include using the control circuit 110 to drive the TEC 102, the supply $V_{DD}$ can be about 2.7 to 5.5 V. The bias signal $V_B$ can be a specified voltage, such as 1.5V or 2.5V, such as depending on the supply voltage. In an example, the bias signal $V_B$ is about 1.5V when the supply $V_{DD}$ is less than about 4V. In an example, the bias signal $V_B$ is about 2.5V when the supply $V_{DD}$ is greater than 4V.

Figure 3:
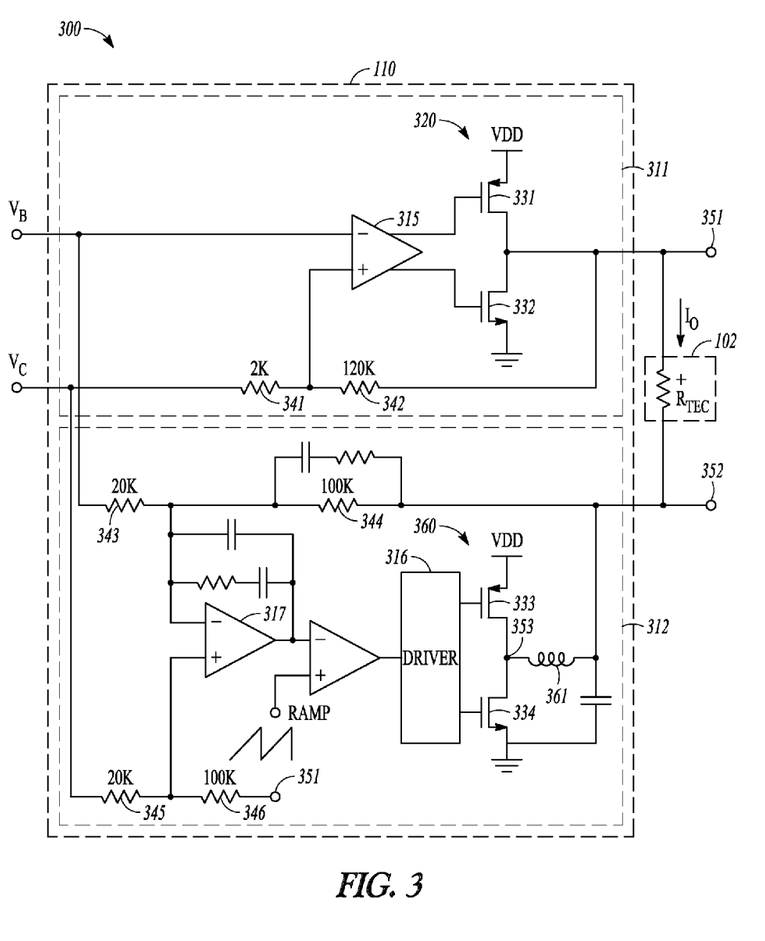
FIG. 3 illustrates generally an example that can include a power regulator circuit.

FIG. 3 illustrates generally an example 300 that can include the control circuit 110 and the TEC 102. In the example 300 of FIG. 3, the control circuit 110 can include a linear regulator circuit 311 and a buck regulator circuit 312, such as corresponding to the first and second regulator circuits 111 and 112, respectively, in the example of FIG. 2. The example 300 can include the TEC 102, such as modeled by a resistor $R_{TEC}$, coupled between respective outputs of the linear regulator circuit 311 and the buck regulator circuit 312. The linear regulator output node 351 and the buck regulator output node 352 can be configured to sink or supply the load current $I_O$ to the TEC 102. When the load current $I_O$ has a first polarity, a corresponding first voltage having a first polarity can exist across $R_{TEC}$, and when the load current $I_O$ has an opposite second polarity, a corresponding second voltage having an opposite second polarity can exist across $R_{TEC}$.

The linear regulator circuit 311 can include a complementary output 320 having first and second transistors 331 and 332 that can be configured to sink or supply the load current $I_O$. In an example, the first transistor 331 is a p-type FET device, and the second transistor 332 is an n-type FET device. In an example, the first and second transistors 331 and 332 are biased into a conducting or "on" state, such as by an amplifier circuit 315. That is, at least some small bias current can be configured to flow from the supply $V_{DD}$ to the reference node GND. The bias current can help ease a transition from a first load current $I_O$ polarity to an opposite second polarity. For example, at or near a supply limit, one of the first and second transistors 331 and 332 can supply the load current $I_O$ to maintain the output voltage, and the other of the first and second transistors 331 and 332 can provide a small bias current to the load. In an example, the first and second transistors 331 and 332 can be arranged as a complementary output circuit such that the transistors are not simultaneously providing more than the bias current.

In an example, the linear regulator circuit 311 has a closed loop gain that can be provided by a feedback circuit. The linear regulator feedback circuit can include first and second resistors 341 and 342. The ratio of the resistances of the first resistor 341 and the second resistor 342 determines the gain of the linear regulator feedback circuit. In an example, a closed loop gain of the feedback circuit can be set to about −60V/V, such as when the first resistor 341 has a resistance of about 2 kΩ, and the second resistor 342 has a resistance of about 120 kΩ. The linear regulator circuit 311 can be configured to operate in a linear or saturation region according to the voltage signal at $V_C$. In an example, when a difference between $V_C$ and $V_B$ is small, the first and second transistors 331 and 332 can operate in the saturation region. When a difference between $V_C$ and $V_B$ is large, one of the first and second transistors 331 and 332 can operate in the linear region, and the other of the transistors can be off. In an example, the linear regulator circuit can include a Monticelli Class AB output stage to control the drain currents of the first and second transistors 331 and 332. In an example, the p-type first transistor 331 and the n-type second transistor 332 can be integrated on the same circuit device, and the transistors' respective $V_{GS}$ voltages can be substantially controlled.

The buck regulator circuit 312 can include an output 360 having at least one power transistor at the supply $V_{DD}$. In the example 300 of FIG. 3, the power transistor is the third transistor 333. In an example, the buck regulator circuit 312 is a synchronous buck regulator with a fourth transistor 334 coupled to the reference node GND and to the third transistor 333 at a switched node 353. The third and fourth transistors 333 and 334 can be configured to operate as switching devices, alternately conducting from $V_{DD}$ to the buck regulator output node 352, or from the buck regulator output node 352 to the reference node GND. For example, at least one of the third and fourth transistors 333 and 334 can be driven between an off or non-conducting state and an on state. The other at least one of the third and fourth transistors 333 and 334 can operate under low $V_{DS}$, and the current can be limited by the load.

In an example, the third transistor 333 is a p-type FET device, and the fourth transistor 334 is an n-type FET device, and the drains of the third and fourth transistors 333 and 334 can be coupled at the switched node 353. In an example, the buck regulator circuit 312 includes a switch driver circuit 316, such as can have one or more driver outputs coupled to the gates of the third and fourth transistors 333 and 334. A control for the switch driver circuit 316 can generate a pulse-width modulated (PWM) signal that can be used to control switching of the third and fourth transistors 333 and 334.

In an example, the buck regulator circuit 312 can have a closed loop gain that can be adjusted by a circuit network including third, fourth, fifth, and sixth resistors 343, 344, 345, and 346. In an example, when the resistances of the third and fifth resistors 343 and 345 are about the same, and when the resistances of the fourth and sixth resistors 344 and 346 are about the same, the output of the buck regulator circuit 312 can be given by:

$$V_{352} = \frac{R_{344}}{R_{343}}(V_C - V_B) + V_{351}. \qquad \text{Equation (1)}$$

The closed loop gain of the buck regulator circuit 312 can be set by a ratio of the resistance values provided by the third and fourth resistors 343 and 344. In the example of FIG. 3, the closed loop gain of the buck regulator circuit 312 can be about 5V/V. The input to output DC transfer function of the buck regulator circuit 312 power stage can be given by:

$$V_{TEC} = V_{351} - V_{352} = \frac{R_{344}}{R_{343}}(V_B - V_C). \qquad \text{Equation (2)}$$

In an example, the buck regulator circuit 312 can include an amplifier circuit 317. The amplifier circuit 317 output can be compared with a PWM ramp signal, such as to generate a duty cycle to operate the third and fourth transistors 333 and 334 in the output 360 of the buck regulator circuit 312. The voltage signals at the inverting and non-inverting terminals of the amplifier circuit 317 can be balanced by adjusting the output of the buck regulator circuit 312 by way of the output of the amplifier circuit 317. In an example, a frequency compensation circuit (e.g., type III) can be provided to control a closed-loop frequency response characteristic of the buck regulator circuit 312.

From Equation (2), the TEC output voltage $V_{TEC}$, such as the voltage across the TEC 102, can be positive or negative, such as depending on the input signal $V_C$. In an example, when $V_C$ is less than $V_B$, then $V_{TEC}$ can be positive, corresponding to a cooling mode of the TEC 102. When $V_C$ is greater than $V_B$, then $V_{TEC}$ can be negative, corresponding to a heating mode of the TEC 102.

In the example 300 of FIG. 3, either of the linear regulator circuit 311 or the buck regulator circuit 312 can be configured to provide or sink a current signal, such as depending upon the TEC output voltage $V_{TEC}$. When the TEC output voltage $V_{TEC}$ is positive, the linear regulator circuit can provide the load current $I_O$. Under these conditions, the load current can be delivered to the load (e.g., to the TEC 102) from the supply $V_{DD}$ and through the first transistor 331, and the buck regulator circuit 312 can be configured to sink the load current $I_O$ from the buck regulator output node 352 to the supply $V_{DD}$ or the reference node GND, such as via an inductor 361 and the third and fourth transistors 333 and 334.

In an example, a current sensor circuit can provide information about the load current $I_O$. The current sensor circuit can be integrated on the same circuit as, for example, a portion of the linear regulator circuit 311. The current sensor circuit can be configured to sense information about the load current $I_O$ when the load current $I_O$ flows in positive or negative directions. In an example, an output of the current sensor circuit can include a voltage signal having a voltage sign that is indicative of a sign of the load current $I_O$, and having a voltage magnitude that is approximately directly proportional to the load current $I_O$.

In an example, the current sensor circuit can be provided to sense information about the load current $I_O$ using the complementary output 320 of the linear regulator circuit 311. For example, the current sensor circuit can include transistors configured to respectively mirror the first and second transistors 331 and 332 in the complementary output 320 of the linear regulator circuit 311, as further described herein.

Figure 4:
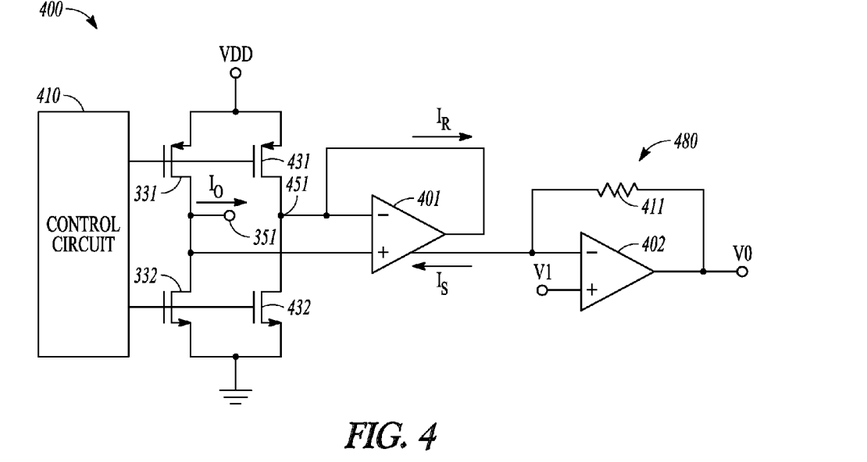
FIG. 4 illustrates generally an example that can include a current sensor circuit.

FIG. 4 illustrates generally an example of a current sensor circuit 400. The current sensor circuit 400 can include the first and second transistors 331 and 332 from the complementary output 320 of the linear regulator circuit 311. The current sensor circuit 400 can include first and second mirror transistors 431 and 432 that correspond respectively to the first and second transistors 331 and 332. The first mirror transistor 431 can include a scaled version, or replica, of the first transistor 331, and the second mirror transistor 432 can include a scaled version, or replica, of the second transistor 332. In an example, the first mirror transistor 431 is scaled by a first factor relative to the first transistor 331, and the second mirror transistor 432 is scaled by a similar or different second factor relative to the second transistor 332. In an example, the first and second transistors 331 and 332 and the first and second mirror transistors 431 and 432 can be driven by a control circuit 410. In an example, separate control circuits can be configured to drive one or more of the first and second transistors 331 and 332 and the first and second mirror transistors 431 and 432.

The first and second transistors 331 and 332 can be coupled at their respective drain terminals, such as at the linear regulator output node 351, to sink or supply the load current $I_O$. In an example, the first and second mirror transistors 431 and 432 can be coupled at their respective drain terminals, such as at a mirror node 451. The source terminals of the first transistor 331 and the first mirror transistor 431 can be respectively coupled to the supply $V_{DD}$, and the gate terminals of the first transistor 331 and the first mirror transistor 431 can be respectively configured to receive a first drive signal from the control circuit 410. The source terminals of the second transistor 332 and the second mirror transistor 432 can be respectively coupled to the reference GND, and the gate terminals of the second transistor 332 and the second mirror transistor 432 can be respectively configured to receive a second drive signal from the control circuit 410.

In an example, a voltage or current at the mirror node 451 can be adjusted to match or approximate a voltage or current at the linear regulator output node 351, such as using a first buffer circuit 401. The buffer circuit 401 can be configured to sense information about a current or voltage at the linear regulator output node 351 (e.g., about the load current $I_O$) and, in response, drive the mirror node 451 at a corresponding current and voltage.

In an example, the buffer circuit 401 can be configured to sink or supply a current signal $I_R$ at the mirror node 451 to drive a voltage at the mirror node 451 to match or approximate the voltage at the linear regulator output node 351. The current signal $I_R$ can be substantially proportional to the load current $I_O$. In an example, the current signal $I_R$ can be scaled from the load current $I_O$ by a scaling factor that corresponds to the relative scale of the first transistor 331 to the first mirror transistor 431.

The buffer circuit 401 can include an amplifier circuit having inverting and non-inverting input terminals, and a first output terminal configured to sink or supply the current signal $I_R$. In an example, the amplifier circuit is configured as a voltage follower, such as for unity gain, with a common-mode input range that extends from rail to rail. The non-inverting input terminal of the amplifier circuit can be coupled to the linear regulator output node 351, and the inverting input terminal of the amplifier circuit can be coupled to the mirror node 451. The amplifier circuit can be configured to sink or supply the current signal $I_R$ in response to a difference between the voltage signals at the amplifier circuit input terminals, such as to drive the voltage at the mirror node 451 to match or approximate the voltage at the linear regulator output node 351. The current signal $I_R$ can have a current signal magnitude that is about the same as a difference between the drain currents of the first and second mirror transistors 431 and 432.

In an example, the first mirror transistor 431 can be a scaled version of the first transistor 331 in the complementary output 320. The first mirror transistor 431 can be configured such that it receives approximately the same $V_{GS}$ and $V_{DS}$ voltages as the first transistor 331. In an example, when the first transistor 331 and the first mirror transistor 431 are on, or configured to conduct, the second transistor 332 and the second mirror transistor 432 can be substantially off. Under these conditions, the drain current of the first mirror transistor 431 can be a scaled version of the load current $I_O$ at the linear regulator output node 351. The buffer circuit 401 can be configured to sink this drain current of the first mirror transistor 431.

In an example, the first transistor 331 and the first mirror transistor 431 can be substantially off, and the second transistor 332 and the second mirror transistor 432 can be on, or configured to conduct. Under these conditions, the buffer circuit 401 can be configured to source current to the second mirror transistor 432, such as to make the drain voltage of the second mirror transistor 432 substantially the same as the voltage at the linear regulator output node 351. The resulting current signal $I_R$ can be proportional to the load current $I_O$, that is, $$I_O = nI_R. \quad \text{Equation (3)}$$

In Equation (3), the scaling factor n can be a common scaling ratio between the first and second transistors 331 and 332 and the first and second mirror transistors 431 and 432, respectively. In an example, different scaling factors can be used for each transistor pair. For example, the first transistor 331 and the first mirror transistor 431 can be scaled by $n_1$ and the second transistor 332 and the second mirror transistor 432 can be scaled by $n_2$. In an example, the relationship between $I_O$ and $I_R$ that is provided in Equation (3) can be maintained when all of the transistors in the current sensor circuit 400 are on.

In an example, the buffer circuit 401 can include a second output configured to sink or supply a current sense signal $I_S$. The current sense signal $I_S$ can be proportional to the current signal $I_R$, that is, $$I_R = mI_S. \quad \text{Equation (4)}$$

In an example, the current sense signal $I_S$ can have one of a first or second polarity, such as depending upon a polarity of the $I_R$ current. The current sense signal $I_S$ can thus be a scaled replica of the load current $I_O$.

In the example of FIG. 4, the current sensor circuit 400 includes an output circuit 480 that can be configured to provide a voltage output signal $V_O$ that is indicative of the load current $I_O$. In an example, the voltage output signal $V_O$ can be proportional to the current $I_O$.

In an example, the output circuit 480 can include an output resistor configured to receive the sense signal $I_S$ from the buffer circuit 401. The voltage output signal $V_O$ can be provided as the voltage across the output resistor. In an example, a voltage source can be provided between the output resistor and a reference node, such as to adjust or bias the voltage output signal $V_O$.

In the example of FIG. 4, the output circuit 480 can include a feedback resistor 411 and an output amplifier circuit 402. The output circuit 480 can be configured to direct the current sense signal $I_S$ through the feedback resistor 411 to develop a voltage that is proportional to the load current $I_O$. The output amplifier circuit 402 can be configured to drive one of its input terminals (e.g., a negative input terminal) to a reference voltage $V_1$, such as by sourcing or sinking current through the feedback resistor 411.

The output amplifier circuit 402 can include a PMOS or NMOS input pair. The common-mode input of the output amplifier circuit 402 can be substantially controlled, and the output amplifier circuit 402 can have a relaxed offset requirement, such as relative to the buffer circuit 401. This can be because the signal of interest is a voltage across the feedback resistor 411, which can be on the order of about a volt or more. Any error introduced by the offset can be a relatively small fraction of the signal voltage, such as even without applying any additional offset reduction techniques.

The reference voltage $V_1$ can provide a reference voltage level at the output of the output amplifier circuit 402, such as when the load current $I_O$ is zero. That is, when the sensed load current $I_O$ is zero, the voltage output signal $V_O$ can be substantially equal to the reference voltage $V_1$. In an example, the voltage output signal can be given by:

$$V_O = \frac{R_{411}}{m \cdot n} I_O + V_1. \qquad \text{Equation (5)}$$

Alternatively, $V_O$ can be expressed as a sum of the reference voltage $V_1$ and the voltage across the feedback resistor 411, that is, $V_O = V_1 + I_S * R_{411}$.

Equation (5) can show that an overall gain of the current sensor circuit 400 can depend upon, among other things, the scaling factors m and n, and the resistance of the resistor 411. For example, the scaling factor n can be used when the scaling factor 11 is common between the first and second transistors 331 and 332 and the first and second mirror transistors 431 and 432, respectively. Equation (5) can be adjusted to accommodate transistor pairs that are differently scaled.

Variation in any of the resistor 411 or the scaling factors m or n can correspond to variation of the current sensor output. In an example where a scaling ratio of the p-type devices does not match the scaling ratio of the n-type devices, a gain variation can result, such as when the load current $I_O$ undergoes a polarity transition.

The present inventors have recognized that a problem to be solved can include improving the accuracy of the current sensor circuit 400, such as at or near polarity transitions of the load current $I_O$. The present subject matter can help provide a solution to this problem, such as by adjusting the scaling factor used to provide the first transistor 331 and the first mirror transistor 431, or by adjusting the scaling factor used to provide the second transistor 332 and the second mirror transistor 432.

In an example, the first transistor 331 and the first mirror transistor 431 are p-type transistors, and the second transistor 332 and the second mirror transistor 432 are n-type transistors. Due to differences in construction, various characteristics of the respective p-type and n-type transistors can vary. To address such differences, one or more relatively small segments of at least one transistor (e.g., from each corresponding pair of transistors) can be permanently switched in or out of its active path to "trim" an output characteristic of the at least one transistor.

In an example, accuracy of the current sensor circuit 400 can be alternatively or additionally improved using a trim circuit, such as shown in the example of a second current sensor circuit 500. The second current sensor circuit 500 is illustrated generally in FIG. 5, and can include a trim circuit 420 and an adjustable resistor 412. The trim circuit 420 can be configured to correct or compensate for one or more of an offset error or a gain error, such as can be introduced into the second current sensor circuit 500 by a device mismatch, such as due to manufacturing process variations. The trim circuit 420 can correct or compensate for such errors by adjusting a resistance provided by the adjustable resistor 412. Adjusting the resistance provided by the adjustable resistor 412 can change a gain of the current sensing function of the second current sensor circuit 500 (see, e.g., Equation (5)). In an example, different or separate trim circuits can be used to address each of a gain error and an offset error.

Figure 5:
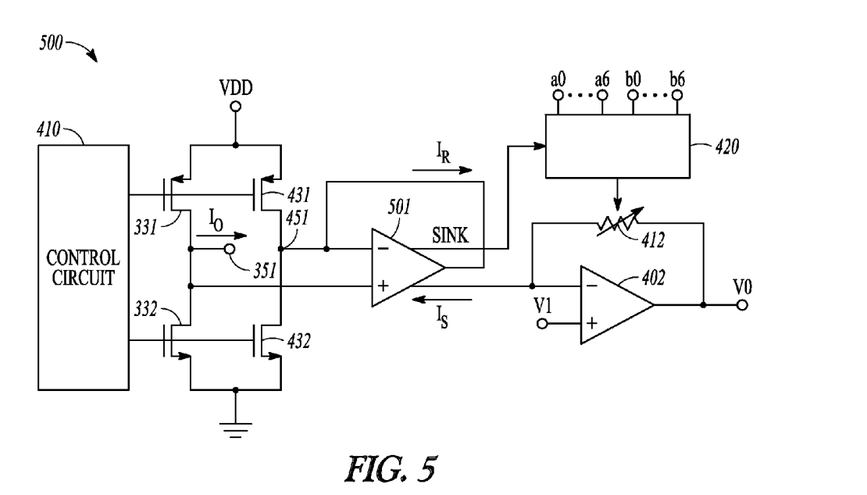
FIG. 5 illustrates generally an example that can include a current sensor circuit and a trim circuit.

In the example of FIG. 5, the second current sensor circuit 500 can include a second buffer circuit 501 having first and second outputs to sink or supply the current signal $I_R$ and the current sense signal $I_S$, such as described in the example of FIG. 4, above. The second buffer circuit 501 can include a third output that can be configured to provide a logic signal SINK to the trim circuit 420. The logic signal SINK can include information about a polarity of the load current $I_O$. In response to the logic signal SINK, the trim circuit 420 can adjust a resistance value provided by the adjustable resistor 412. For example, in response to a first polarity indicated by the logic signal SINK, the trim circuit 420 can adjust the adjustable resistor 412 to provide a first resistance value, and in response to a second polarity indicated by the logical signal SINK, the trim circuit 420 can adjust the adjustable resistor 412 to provide a second greater or lesser resistance value. The adjustable resistor 412 can be provided in a current path that is common to both positive and negative load current $I_O$ polarities. Thus, a single trim circuit 420 can be used to correct a gain error for the sensed current for each polarity.

In an example, the trim circuit 420 can include one or more trim circuit configuration inputs. In the example of FIG. 5, the trim circuit configuration inputs are labeled a0 . . . a6 and b0 . . . b6 to indicate that the trim circuit includes two sets of seven configuration inputs, however, as few as one configuration input can be used. In response to a specified signal at the trim circuit configuration inputs, the trim circuit 420 can adjust the resistance of the adjustable resistor 412 by a corresponding amount. For example, the first set of seven configuration inputs (e.g., a0 . . . a6) can correspond to the first resistance value when the logic signal SINK indicates the first polarity of the load current $I_O$, and the second set of seven configuration inputs (e.g., b0 . . . b6) can correspond to the second resistance value when the logic signal SINK indicates the opposite polarity of the load current $I_O$. That is, the trim circuit 420 can transition its output state in coordination with a transition in the load current $I_O$ polarity. In an example, the one or more configuration inputs of the trim circuit 420 are user-accessible, and in other examples, the configuration inputs of the trim circuit 420 are pre-set, such as during device manufacturing.

In an example, offset reduction techniques such as chopping or auto-zeroing can be used to meet an error budget. In some examples, two low-offset amplifiers can be used to generate a scaled-down version of the load current $I_O$ for first and second load current $I_O$ polarity conditions. However, low-offset amplifier circuit designs can be costly in terms of silicon area. The present subject matter can help to avoid using chopping and auto-zeroing techniques, or using multiple low-offset amplifier circuits. The current sensor circuits 400 or 500 can be configured to use a single low-offset amplifier circuit (see, e.g., the buffer circuit 401) to sense information about a load current $I_O$ having first or second polarities.

Figure 6:
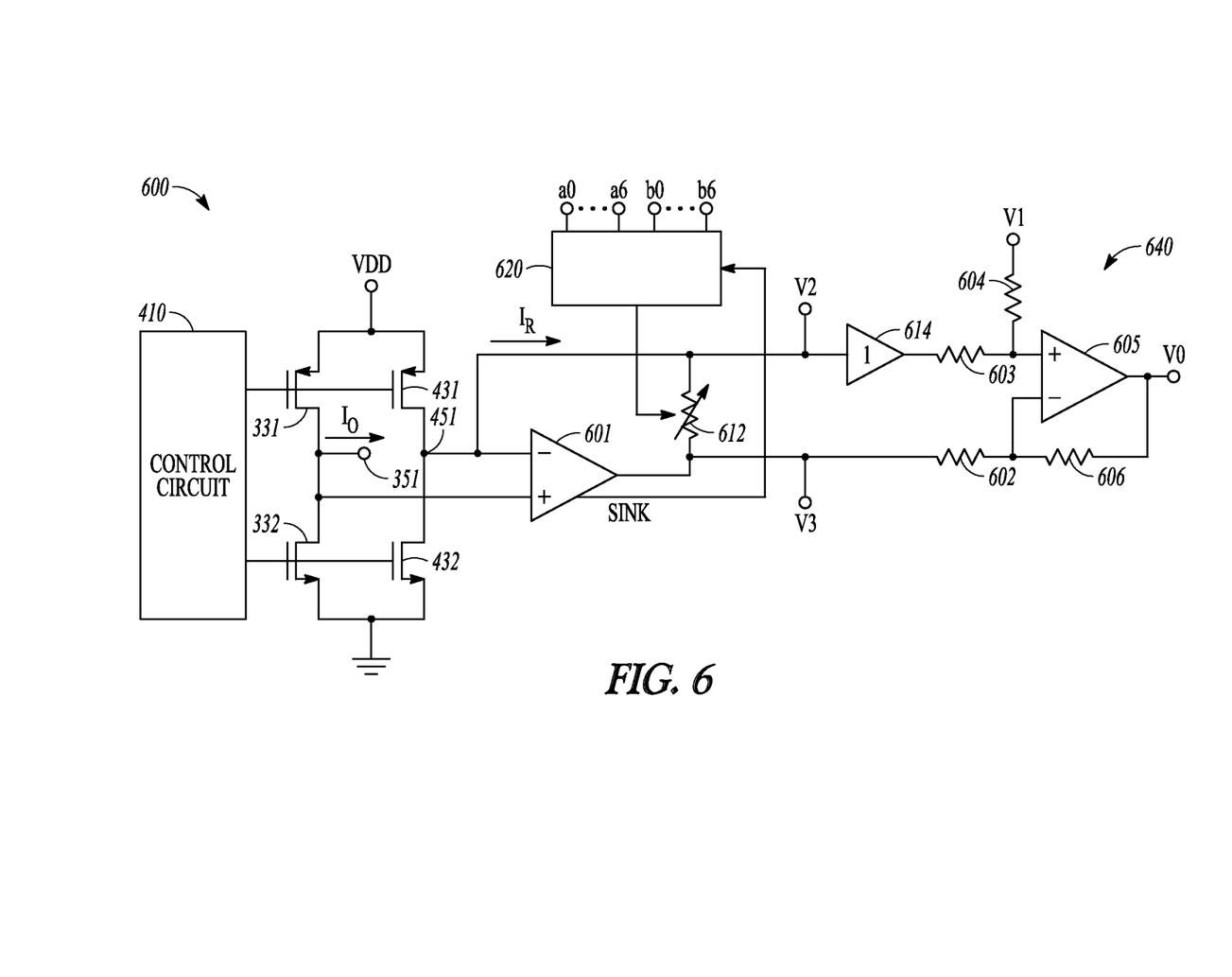
FIG. 6 illustrates generally an example that can include a current sensor circuit and a trim circuit.

FIG. 6 illustrates generally an example of a third current sensor circuit 600. The third current sensor circuit 600 can include the first and second transistors 331 and 332 (e.g., corresponding to a complementary output stage of a regulator circuit), the first and second mirror transistors 431 and 432, and a second trim circuit 620.

The second trim circuit 620 can be configured to correct or compensate for one or more of an offset error or a gain error, such as by adjusting the resistance provided by a second adjustable resistor 612. The second adjustable resistor 612 can be placed in a path between an output of a second buffer circuit 601 and an input of the second buffer circuit 601. The input of the second buffer circuit 601 can be configured to receive information about a voltage at the mirror node 451.

In an example, a unity gain buffer circuit 614 can be provided between the second adjustable resistor 612 and an output circuit 680. The unity gain buffer circuit 614 can be configured to provide voltage information to the output circuit 680 while inhibiting or preventing current from flowing from the second buffer circuit 601 output to the output circuit 680. The output circuit 680 can be configured to provide a voltage output signal $V_O$ that is indicative of the load current $I_O$.

In the example of FIG. 6, the output circuit 680 can include multiple resistors as shown. A first resistor 601 and a fourth resistor 604 can be selected to have about the same first resistance value. A second resistor 602 and a third resistor 603 can be selected to have about the same second resistance value. Under these conditions, the voltage output signal $V_O$ can be given by:

$$V_O = \frac{R_{601}}{R_{602}}(V_2 - V_3) + V_1. \qquad \text{Equation (6)}$$

In an example, the current signal $I_R$ can be a scaled version of the load current $I_O$, such that $(V_2-V_3)=R_{612}(I_O/n)$. Thus, the voltage output signal $V_O$ can be given by:

$$V_O = \frac{R_{601}}{R_{602}}\frac{I_O}{n}R_{612} + V_1. \qquad \text{Equation (7)}$$

Figure 7:
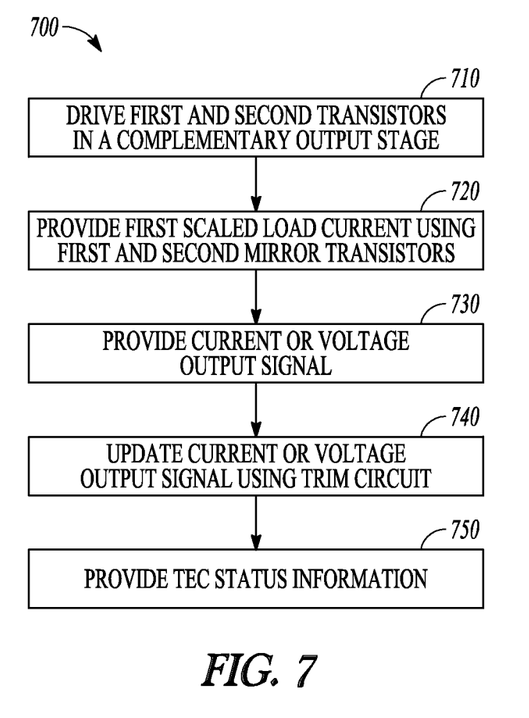
FIG. 7 illustrates generally an example that can include providing a scaled current output signal.

FIG. 7 illustrates generally an example 700 that can include providing a scaled current output signal. At 710, the example 700 can include driving first and second transistors in a complementary output stage. The complementary output stage can include an output stage of a power regulator circuit, such as the complementary output stage 320 of the linear regulator circuit 311 in the example of FIG. 3. Driving the first and second transistors 331 and 332 in the complementary output stage 320 can include using the amplifier circuit 315 to drive the gates of the first and second transistors 331 and 332. In an example, the driving the transistors at 710 can include biasing the first and second transistors 331 and 332 into an always-on state. In the always-on state, at least one of the first and second transistors 331 and 332 can conduct just above that transistor's cut-off threshold.

In an example, at 710, driving the first and second transistors 331 and 332 in the complementary output stage 320 can include providing a load current $I_O$ to an output. The load current $I_O$ can include a first current, such as having a first polarity or first direction, such as corresponding to a current flowing from a supply through the first transistor 331. The load current $I_O$ can alternatively include a second current, such as having a second polarity or second direction, such as corresponding to a current flowing from the output through the second transistor 332.

At 720, the example 700 can include providing a first scaled load current signal. The load current signal can be provided using mirror transistors, such as the first and second mirror transistors 431 and 432 corresponding respectively to the first and second transistors 331 and 332. In an example, the first scaled load current signal can be provided at a mirror node where the drains of the first and second mirror transistors 431 and 432 are coupled. In an example, the first scaled load current signal is a scaled version of the load current $I_O$. The scaling ratio between the load current and the first scaled load current signal can be about the same as the scaling ratio between the first transistor 331 and the first mirror transistor 431.

At 730, a current or voltage output signal can be provided. In an example, a buffer circuit can be configured to maintain or adjust a voltage at the mirror node, such as by sinking or supplying a current at the mirror node. The voltage at the mirror node can be updated to match a voltage at the output of the complementary output stage 320.

At 740, the example 700 can include updating a current or voltage output signal using a trim circuit. For example, the current or voltage output signal can be adjusted, or trimmed, using an output amplifier circuit that can be configured to amplify or attenuate the current or voltage output signal depending on a sensed polarity of the load current $I_O$. In an example, the output signal can include a voltage signal, and the voltage signal can be attenuated by a first amount when the load current $I_O$ has a first polarity, and the voltage signal can be attenuated by a second amount when the load current $I_O$ has a second polarity.

At 750, the example 700 can include providing a thermoelectric heating or cooling device (TEC) status indication. A TEC status indication can include an indication of whether the TEC is in a heating or cooling mode, and can optionally include an indication of an expected heat transfer rate. In an example, the TEC status indication can be based on the current or voltage output signal provided at 730 or 740.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. For example, a switching or control signal can be provided to one or more switches in a converter circuit according to instructions on a computer-readable medium, such as can be implemented by a processor circuit. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A bidirectional current sensor circuit to sense a load current provided by a complementary output circuit, the complementary output circuit including first and second transistors coupled at an output node and configured to provide or receive the load current at the output node, the load current comprising respective first or second currents at respective first or second reference nodes through respective ones of the first or second transistors, the current sensor circuit comprising:

a first mirror transistor, coupled between the first reference node and a mirror node, the first mirror transistor comprising a scaled version of the first transistor;

a second mirror transistor, coupled between the mirror node and the second reference node, the second mirror transistor comprising a scaled version of the second transistor; and a buffer circuit configured to drive a voltage at the mirror node to substantially match a voltage at the output node, wherein the buffer circuit provides a signal indicative of a magnitude or a polarity of the load current when the voltage at the output node and the voltage at the mirror node are about the same magnitude.

2. The current sensor circuit of claim 1, comprising a thermoelectric heating or cooling device configured to provide or receive the load current at the output node, wherein a first polarity of the load current corresponds to a heating mode of the TEC device, and wherein a second polarity of the load current corresponds to a cooling mode of the TEC device.

3. The current sensor circuit of claim 1, wherein the buffer circuit includes an amplifier circuit with differential input terminals that are coupled respectively to the output node and the mirror node, wherein the amplifier circuit includes a first amplifier output configured to provide a first current signal indicative of the load current.

4. The current sensor circuit of claim 3, wherein the first amplifier output of the amplifier circuit is configured to sink or supply a first current signal that is indicative of a magnitude of the load current and is indicative of a polarity of the load current.

5. The current sensor circuit of claim 3, wherein the first amplifier output of the amplifier circuit is coupled to the mirror node and to one of the differential input terminals, and wherein the first amplifier output of the amplifier circuit is configured to sink or supply a first current signal that corresponds to a difference between currents in the first and second mirror transistors.

6. The current sensor circuit of claim 3, wherein the first amplifier output of the amplifier circuit is coupled to the mirror node and to one of the differential input terminals, and wherein the amplifier circuit includes a second amplifier output that is configured to provide a second current signal that is proportional to the first current signal and is proportional to the load current.

7. The current sensor circuit of claim 3, comprising a current-to-voltage converter circuit, wherein the amplifier circuit includes a second amplifier output that is configured to provide a second current signal to the current-to-voltage converter circuit, and wherein the current-to-voltage converter circuit is configured to provide a voltage signal that is indicative of at least one of a polarity or a magnitude of the load current.

8. The current sensor circuit of claim 1, comprising a first amplifier circuit, the first amplifier circuit including first and second input terminals, and a first amplifier output configured to provide a voltage signal indicative of the load current, wherein the first input terminal is configured to receive the signal indicative of the load current from the buffer circuit, and wherein the second input terminal is configured to receive a reference voltage signal.

9. The current sensor circuit of claim 8, comprising a feedback circuit between the first amplifier output and one of the first and second input terminals, the feedback circuit including a resistor.

10. The current sensor circuit of claim 9, comprising a trim circuit, wherein the trim circuit is configured to update a resistance of the resistor in the feedback circuit using information about a polarity of the load current.

11. The current sensor circuit of claim 9, comprising a trim circuit, wherein the trim circuit is configured to update a resistance of the resistor in the feedback circuit using information from the buffer circuit;
  wherein the first and second mirror transistors, the buffer circuit, the second amplifier circuit, the feedback circuit, and the trim circuit comprise portions of an integrated circuit.

12. The current sensor circuit of claim 1, wherein the first mirror transistor and the first transistor in the complementary output circuit are integrated on a common circuit substrate and are scaled by a first ratio, and wherein the second mirror transistor and the second transistor in the complementary output circuit are integrated on the same common circuit substrate and are scaled by a second ratio.

13. The current sensor circuit of claim 12, wherein at least one of the first transistor, the first mirror transistor, the second transistor, and the second mirror transistor is configured to provide a fractional output to balance the first and second ratios.

14. A temperature regulator system including a bidirectional current sensor circuit, the temperature regulator system comprising:
  a linear regulator circuit, including a complementary output circuit stage having first and second transistors that are configured to sink or supply a load current at a first power terminal of a thermoelectric heating or cooling device, the load current comprising respective first or second currents from respective first or second reference nodes through respective ones of the first or second transistors to the first power terminal;
  a buck regulator circuit having first and second switches that are configured to sink or supply a portion of the load current at a second power terminal of the thermoelectric device, the load current comprising respective third or fourth currents from the first or second reference nodes through respective ones of the first or second switches to the second power terminal; and
  a current sensor circuit, comprising:
    a first mirror transistor, coupled between the first reference node and a mirror node, the first mirror transistor comprising a scaled version of the first transistor;
    a second mirror transistor, coupled between the mirror node and the second reference node, the second mirror transistor comprising a scaled version of the second transistor; and
    a buffer circuit having differential input terminals that are coupled respectively to the mirror node and the first power terminal of the thermoelectric device, wherein the buffer circuit includes a first amplifier output configured to provide a current signal that is indicative of the load current.

15. The temperature regulator system of claim 14, comprising a trim circuit, the trim circuit configured to update the output voltage signal using information from the buffer circuit about the current signal indicative of the load current;
  wherein the current sensor circuit comprises a second amplifier circuit configured to receive the current signal that is indicative of the load current and, in response, provide an output voltage signal that is indicative of at least one of a polarity or magnitude of the load current at the first power terminal of the thermoelectric device.

16. The temperature regulator system of claim 14, wherein the buck regulator circuit is a synchronous buck regulator circuit, and wherein the linear regulator circuit and the synchronous buck regulator circuit comprise portions of an integrated circuit.

17. A method for sensing a load current signal magnitude or load current signal polarity using a complementary output stage of a power converter circuit, the method comprising:
  driving first and second transistors in the complementary output stage to provide a load current to an output node, the load current comprising respective first or second currents from respective first or second reference nodes through respective ones of the first or second transistors to the output node;
  providing a first scaled load current signal using first and second mirror transistors that correspond to the first and second transistors in the complementary output stage, respectively;
  using a buffer circuit, updating a voltage across at least one of the first and second mirror transistors to approximate a voltage across a corresponding one of the first and second transistors in the complementary output stage; and
  providing an output current signal using the buffer circuit, wherein the output current signal includes information about the load current signal magnitude and about the load current signal polarity.

18. The method of claim 17, comprising providing an operation status indication about a thermoelectric heating and cooling device using the output current signal.

19. The method of claim 17, wherein providing the first scaled load current signal includes using a first mirror transistor that is a scaled replica of the first transistor in the complementary output stage, and using a second mirror transistor that is a scaled replica of the second transistor in the complementary output stage.

20. The method of claim 17, comprising:
  providing an output voltage signal that is based on the output current signal from the buffer circuit and a reference voltage signal, the providing the output voltage signal using a second buffer circuit;
  providing a feedback signal, using a feedback circuit, between input and output terminals of the second buffer circuit; and
  updating a resistance characteristic of the feedback circuit using information about a change in the load current signal polarity;
  wherein providing the output voltage signal includes providing a first voltage magnitude that is greater than the reference voltage magnitude when the load current has a first polarity, and wherein the providing the output voltage signal includes providing a second voltage magnitude that is less than the reference voltage magnitude when the load current has an opposite second polarity.

* * * * *